United States Patent
Choi et al.

(10) Patent No.: US 11,688,887 B2
(45) Date of Patent: Jun. 27, 2023

(54) SLAVE BMS INSPECTION SYSTEM AND METHOD

(71) Applicant: LG Chem, Ltd., Seoul (KR)

(72) Inventors: Yean Sik Choi, Daejeon (KR); Chan Ha Park, Daejeon (KR); Seong Yeol Yang, Daejeon (KR)

(73) Assignee: LG Energy Solution, Ltd.

( * ) Notice: Subject to any disclaimer, the term of this patent is extended or adjusted under 35 U.S.C. 154(b) by 192 days.

(21) Appl. No.: 17/053,213

(22) PCT Filed: Jan. 8, 2020

(86) PCT No.: PCT/KR2020/000317
§ 371 (c)(1),
(2) Date: Nov. 5, 2020

(87) PCT Pub. No.: WO2020/166827
PCT Pub. Date: Aug. 20, 2020

(65) Prior Publication Data
US 2021/0265670 A1  Aug. 26, 2021

(30) Foreign Application Priority Data
Feb. 11, 2019 (KR) .................. 10-2019-0015709

(51) Int. Cl.
*H01M 10/42* (2006.01)
*G01R 31/26* (2020.01)
*H04B 1/10* (2006.01)

(52) U.S. Cl.
CPC ...... *H01M 10/425* (2013.01); *G01R 31/2646* (2013.01); *H04B 1/10* (2013.01);
(Continued)

(58) Field of Classification Search
None
See application file for complete search history.

(56) References Cited

U.S. PATENT DOCUMENTS 5,663,963 A     9/1997  Goodwin, III
2008/0298256 A1  12/2008  Matsubara et al.
(Continued)

FOREIGN PATENT DOCUMENTS

CN    103036719 A    4/2013
CN    106603261 A    4/2017
(Continued)

OTHER PUBLICATIONS

Isnin, ("A study on wireless communication error performance and path loss prediction." (2011), University of Plymouth). (Year: 2011).*

(Continued)

*Primary Examiner* — Roy Y Yi
(74) *Attorney, Agent, or Firm* — Lerner David LLP (57) ABSTRACT

A master battery management system (BMS) used for a battery system in which a plurality of slave BMSs and the master BMS communicate wirelessly includes: a receiving unit configured to receive, from each slave BMS, data of the corresponding slave BMS and data transmission information of at least one other slave BMS except for the corresponding slave BMS among the plurality of slave BMS during one period in which each of the plurality of slave BMSs transmits data at least once; and a determination unit configured to determine a communication error or an abnormal slave BMS by using the data of the corresponding slave BMS and the at least one other slave BMS data received from each slave BMS during one period. The data transmission information of the at least one other slave BMS is information on a history that the other slave BMS transmits data.

17 Claims, 9 Drawing Sheets

(52) U.S. Cl.
CPC ............ *H01M 2010/4271* (2013.01); *H01M 2010/4278* (2013.01)

(56) References Cited

U.S. PATENT DOCUMENTS

| | | | |
|---|---|---|---|
| 2011/0161024 A1 | 6/2011 | Sim et al. | |
| 2014/0084708 A1 | 3/2014 | Yun | |
| 2014/0300364 A1 | 10/2014 | Choi | |
| 2014/0347014 A1 | 11/2014 | Lee et al. | |
| 2018/0145521 A1* | 5/2018 | Hwang | G01R 31/382 |
| 2019/0237816 A1 | 8/2019 | Kim et al. | |
| 2019/0252735 A1 | 8/2019 | Sung et al. | |
| 2019/0361075 A1 | 11/2019 | Lee et al. | |
| 2021/0184270 A1 | 6/2021 | Sung et al. | |

FOREIGN PATENT DOCUMENTS

| | | |
|---|---|---|
| EP | 2015182 A2 | 1/2009 |
| EP | 3536542 A1 | 9/2019 |
| JP | H0522329 A | 1/1993 |
| JP | H0936861 A | 2/1997 |
| JP | H11167401 A | 6/1999 |
| JP | 2002051016 A | 2/2002 |
| JP | 2011183937 A | 9/2011 |
| JP | 2012222913 A | 11/2012 |
| JP | 2014230097 A | 12/2014 |
| JP | 6375144 B2 | 8/2018 |
| JP | 2019536215 A | 12/2019 |
| KR | 20110074207 A | 6/2011 |
| KR | 20110113495 A | 10/2011 |
| KR | 101564365 B1 | 10/2015 |
| KR | 20160073109 A | 6/2016 |
| KR | 101768251 B1 | 8/2017 |
| KR | 20170116377 A | 10/2017 |
| KR | 101914549 B1 | 11/2018 |
| KR | 20190005407 A | 1/2019 |
| KR | 20190009635 A | 1/2019 |
| KR | 20190011567 A | 2/2019 |

OTHER PUBLICATIONS

Search Report for European Application No. 20755133 dated Jul. 16, 2021. 2 pgs.
International Search Report for Application No. PCT/KR2020/000317 dated Apr. 14, 2020, 2 pages.
Pan, M. et al., "Data Acquisition and Health Analysis System of Electric Vehicle Batteries Characteristic Using Wireless Sensor" Jun. 2014, pp. 68-72, vol. 12, Issue 12. English Translation of Abstract only.
Search Report dated Feb. 22, 2023 from the Office Action for Chinese Application No. 202080002613.2 dated Feb. 24, 2023, pp. 1-3.

* cited by examiner

SLAVE BMS INSPECTION SYSTEM AND METHOD

CROSS-REFERENCE TO RELATED APPLICATIONS

The present application is a national phase entry under 35 U.S.C. § 371 of International Application No. PCT/KR2020/000317, published in Korean, which claims priority from Korean Patent Application No. 10-2019-0015709, filed on Feb. 11, 2019, all of which are incorporated herein by reference.

TECHNICAL FIELD

The present invention relates to a system and method for a master Battery Management System (hereinafter also referred to as a BMS) to inspect each slave BMS through wireless communication with a plurality of slave BMSs.

BACKGROUND ART

Recently, research and development on secondary batteries have been actively conducted. Here, the secondary batteries, as batteries that can be charged and discharged, mean that they include conventional Ni/Cd batteries and Ni/MH batteries, and recent lithium ion batteries. Among the secondary batteries, the lithium ion battery has an advantage that the energy density is much higher than that of the conventional Ni/Cd battery and Ni/MH battery, and further, the lithium ion battery can be manufactured with a tendency of a small size so that it is used as a power source for a mobile apparatus. In addition, the usage range of the lithium ion battery extends as a power source for electric vehicles, so that the lithium ion battery attracts attention as a next generation energy storage medium.

In addition, a secondary battery is generally used as a battery pack including a battery module in which a plurality of battery cells are connected in series and/or in parallel. And, a state and an operation of a battery pack are managed and controlled by a battery management system.

A battery system composed of a plurality of battery packs may include a master battery management system and a plurality of slave battery management systems. The master battery management system communicates with an upper system to control the operation of the plurality of slave battery management systems. At this time, the master battery management system transmits a command signal to each of the plurality of slave battery management systems through wireless communication.

In addition, the master battery management system wirelessly receives data from each of a plurality of slave battery management systems. The data received includes information related to a battery managed by each of the slave battery management systems. At this time, the master battery management system may determine the state of each slave battery management system based on the data received from the slave battery management systems. However, in determining the state of the slave battery management system, if the master battery management system does not receive data from a specific slave battery management system, it is difficult to distinguish whether the above issue is a problem of wireless communication itself or a slave battery management system.

SUMMARY

Technical Problem

The present invention aims to make it possible to more clearly perform soundness determination in determining the soundness of a slave battery management system as a master battery management system receives data from a slave battery management system.

Technical Solution

A master battery management system according to an embodiment of the present invention included in a battery system in which a plurality of slave BMSs and the master BMS communicate wirelessly includes: a receiving unit configured to receive during a transmission period, from each respective slave BMS of the plurality of slave BMSs, (i) data of the respective slave BMS and (ii) data transmission information indicating that another slave BMS other than the respective slave BMS transmitted data to the master BMS, wherein each of the plurality of slave BMSs is configured to transmit data at least once during the transmission period; and a determination unit configured to identify an error between the master BMS and at least one of the plurality of slave BMSs; and determine a cause of the error based on the data and the data transmission information received from each slave BMS during the transmission period.

In the master battery management system according to an embodiment of the present invention, the determination unit is configured to identify the error for a given slave BMS when there is no data directly received from the given slave BMS during the transmission period.

In the master battery management system according to an embodiment of the present invention, the determination unit is configured to determine that the cause of the error is a communication error between the given slave BMS and the master BMS based on the data transmission information received at the receiving unit including an indication that the given slave BMS transmitted data to the master BMS and the data received at the receiving unit not including data from the given slave BMS.

In the master battery management system according to an embodiment of the present invention, the master battery management system further includes a noise measurement unit configured to measure noise of data received from the plurality of slave BMSs, wherein the determination unit is configured to determine a communication possible state in which communication with the plurality of slave BMSs is possible based on the noise measured in the noise measurement unit.

A first slave battery management system according to an embodiment of the present invention included in a battery system in which a plurality of slave BMSs and a master BMS communicate wirelessly includes: a receiving unit configured to receive a data signal from a second slave BMS, wherein the data signal is directed to the master BMS; a storage unit configured to store data transmission information indicating that the second slave BMS transmitted data to the master BMS based on the received data signal; and a transmission unit configured to transmit, to the master BMS, the data transmission information indicating that the second slave BMS transmitted data to the master BMS.

In the first slave battery management system according to an embodiment of the present invention, the receiving unit is configured to receive a respective data signal from each slave BMS other than the first slave BMS, wherein each data signal is directed to the master BMS, wherein the storage unit is configured to store data transmission information indicating that each other slave BMS transmitted data to the master BMS based on the respective received data signals, and wherein the transmission unit is configured to transmit to the master BMS, the data transmission information indicating that each other slave BMS transmitted data to the master BMS.

In the first slave battery management system according to an embodiment of the present invention, the signal data includes battery information of a battery module managed by the first slave BMS.

In the first slave battery management system according to an embodiment of the present invention, the signal data includes battery information of a battery module managed by the first slave BMS.

In the first slave battery management system according to an embodiment of the present invention, during a transmission period, the transmission unit is configured to transmit data of the first slave BMS first BMS along with the data transmission information to the master BMS at least once.

A slave BMS inspection system including the master battery management system according to any embodiment of the present disclosure, wherein, each of the plurality of slave BMSs includes: a slave receiving unit configured to receive a data signal from at least one other slave BMS, wherein the data signal is directed to the master BMS; a storage unit configured to store data transmission information indicating that the at least one other slave BMS transmitted data to the master BMS based on the received data signal; and a transmission unit configured to transmit, to the master BMS, the data transmission information indicating that the at least one other slave BMS transmitted data to the master BMS.

In a slave battery management system according to an embodiment of the present invention, the determination unit is configured to identify the error for a given slave BMS when there is no data directly received from the given slave BMS during the transmission period.

In a slave battery management system according to an embodiment of the present invention, the determination unit is configured to determine that the cause of the error is a communication error between the given slave BMS and the master BMS based on the data transmission information received at the receiving unit including an indication that the given slave BMS transmitted data to the master BMS and the data received at the receiving unit not including data from the given slave BMS.

A slave BMS inspection method according to an embodiment of the present invention performed by a master battery management system includes: receiving data signals sequentially from each of a plurality of slave BMSs, wherein the received data from each respective BMS includes (i) data of the respective slave BMS from which the data signals are received, received together with (ii) data transmission information indicating that another slave BMS other than the respective slave BMS transmitted data to the master BMS; identifying an error between the master BMS and a specific slave BMS based on the received data signals, and determining a cause of the error based on a combination of the data and the data transmission information received from each of the plurality of slave BMSs.

In a slave BMS inspection method according to an embodiment of the present invention performed by a master battery management system, determining the cause of the error comprises determining that the cause of the error occurs in a specific slave BMS in response to determining that there is no data directly received from the specific slave BMS and that there is no data transmission information received from any of the plurality of slave BMSs indicating that the specific slave BMS transmitted data to the master BMS.

In a slave BMS inspection method according to an embodiment of the present invention performed by a master battery management system, the determining the cause of the error comprises determining that the cause of the error is a communication error between the master BMS and a specific slave BMS in response to determining that there is data transmission information received from any of the plurality of slave BMSs indicating that the specific slave BMS transmitted data to the master BMS but there is no data directly received from the specific slave BMS.

In a slave BMS inspection method according to an embodiment of the present invention performed by a master battery management system, the method further includes: measuring noise of received data when communicating with the plurality of slave BMSs; and determining a state in which communication with the plurality of slave BMSs is possible based on the measured noise.

Advantageous Effects

According to the present invention, it is possible to clearly determine whether a slave battery management system is abnormal through wireless communication between a slave battery management system and a master battery management system.

DETAILED DESCRIPTION

Hereinafter, various embodiments of the present disclosure are disclosed with reference to the accompanying drawings. However, this does not limit various embodiments of the present disclosure to a specific embodiment and it should be understood that the present disclosure covers all the modifications, equivalents, and/or alternatives of this disclosure provided they come within the scope of the appended claims and their equivalents. With respect to the descriptions of the drawings, like reference numerals refer to like elements.

Terms used in various embodiments of the present disclosure are used to describe specific embodiments of the present disclosure, and are not intended to limit the scope of other embodiments. The terms of a singular form may include plural forms unless they have a clearly different meaning in the context. Otherwise indicated herein, all the terms used herein, which include technical or scientific terms, may have the same meaning that is generally understood by a person skilled in the art. In general, the terms defined in the dictionary should be considered to have the same meaning as the contextual meaning of the related art, and, unless clearly defined herein, should not be understood as having an ideal or excessively formal meaning. In any cases, even the terms defined in this specification cannot be interpreted as excluding embodiments of the present disclosure.

In addition, in describing the components of the embodiment of the present invention, terms such as first, second, A, B, (a), and (b) may be used. These terms are only to distinguish the components from other components, and the nature, sequence, or order of the components are not limited by the terms. In addition, if a component is described as being "connected to", "coupled to" or "linked to" another component, the components may be directly connected to or linked to each other but it should be understood that other components may be "connected", "coupled", or "linked" between each component.

Figure 1:
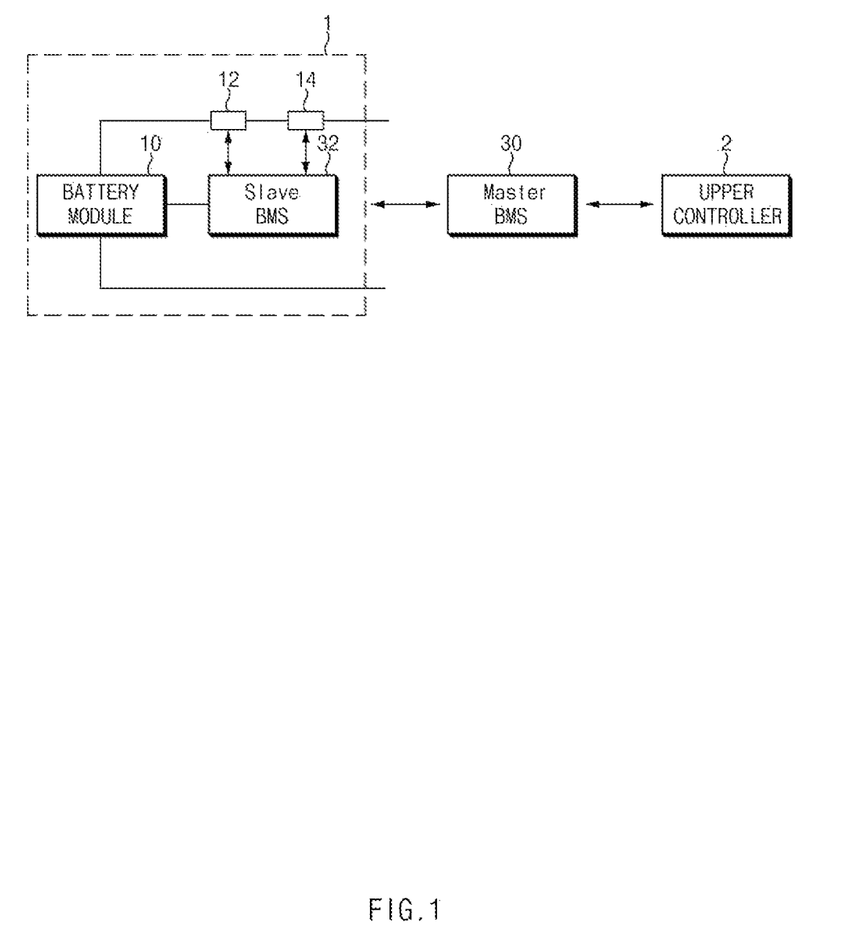
FIG. 1 is a block diagram showing the configuration of a battery control system.

FIG. 1 is a block diagram schematically illustrating a battery control system including a battery pack 1 and an upper controller 2 included in an upper system according to an embodiment of the present invention.

As shown in FIG. 1, the battery pack 1 includes a battery module 10 composed of one or more battery cells and capable of being charged and discharged, a switching unit 14 connected in series to the + terminal side or the − terminal side of the battery module 10 to control the charge/discharge current flow of the battery module 10, and a battery management system 32 that monitors the voltage, current, temperature, and the like of the battery pack 1 to control and manage the battery pack 1 so as to prevent overcharge and overdischarge.

Here, the switching unit 14 is a semiconductor switching element for controlling the current flow for the charge or discharge of the battery module 10, and for example, at least one MOSFET may be used.

In addition, in order to monitor the voltage, current, temperature, etc. of the battery pack 1, the BMS 32 can measure or calculate voltages and currents of gates, sources, and drains of semiconductor switching elements, and in addition, can measure the current, voltage, temperature, etc. of the battery pack using the sensor 12 provided adjacent to the semiconductor switching element. The BMS 32 is an interface for receiving the values obtained by measuring the above-described various parameters, and may include a plurality of terminals and a circuit that is connected to these terminals and processes the received values.

In addition, the BMS 32 may control ON/OFF of the MOSFET and may be connected to the battery module 10 to monitor the state of the battery module 10.

Since the configuration of the battery rack 1 and the configuration of the BMS 32 are known configurations, more detailed description thereof will be omitted.

Meanwhile, the BMS 32 according to the embodiments of the present invention may be connected to an upper BMS (master battery management system 30) so that an operation may be controlled based on a signal applied from the upper BMS. In addition, the upper BMS 30 may be connected to the upper controller 2. Operations of the upper BMS 30 may also be controlled based on a signal applied from the upper controller 2.

Hereinafter, the configuration and method for the soundness evaluation of the slave BMS wirelessly transmitting data to the upper BMS 30 that receives the control signal directly from the upper controller 2 will be described.

Figure 2:
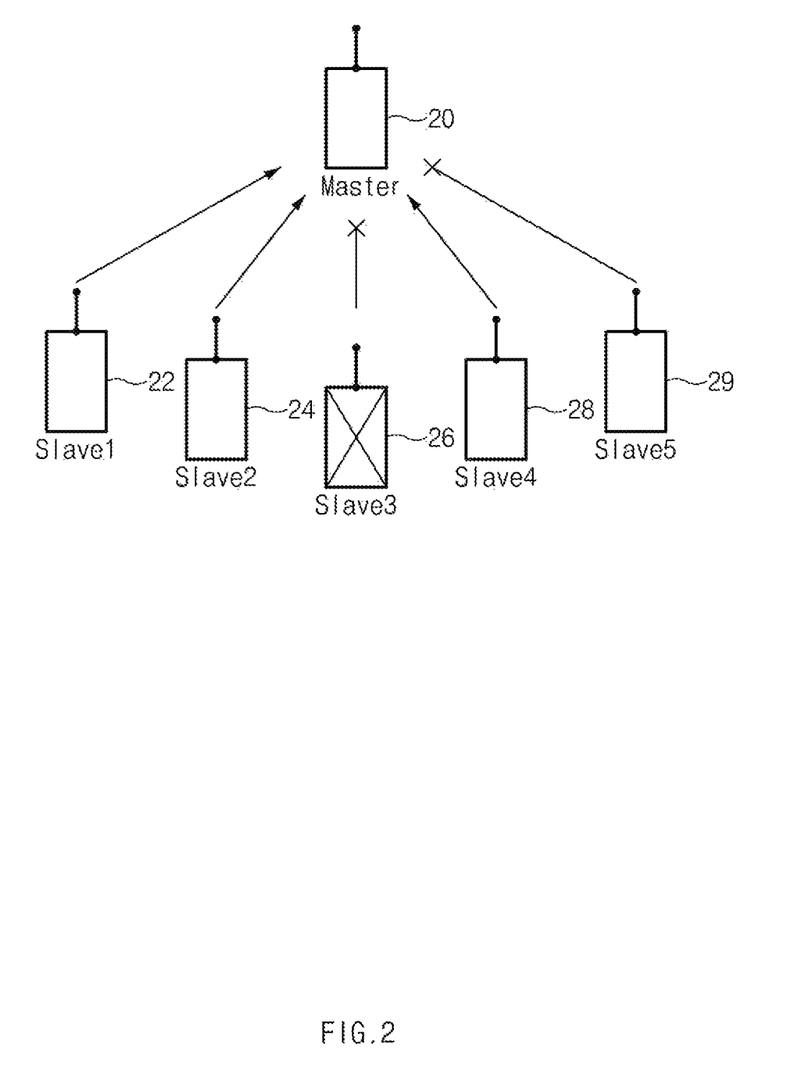
FIG. 2 is a simplified block diagram of a slave BMS inspection system of the prior art.

FIG. 2 is a simplified block diagram of a slave BMS inspection system of the prior art.

The slave BMS inspection system includes a master battery management system 20 and a plurality of slave battery management systems 22 to 29. The master battery management system 20 receives an operation control command signal for each slave battery management system directly from the upper controller 2 and controls each slave battery management system. In addition, the master battery management system 20 wirelessly receives battery-related data from each of the plurality of slave battery management systems 22 to 29 and transmits them to the upper controller 2.

In addition, the slave battery management systems 22 to 29 wirelessly receiving the control signal from the master battery management system 20 perform an operation according to the received control signal. For example, operations of controlling the charging and discharging of each managed battery module or transmitting data on the state of the battery module being monitored to the master battery management system 20 are performed. Thereafter, each of the slave battery management systems 22 to 29 wirelessly transmits data obtained by inspecting the state of the connected battery module 10 according to the control signal or periodically to the master battery management system 20.

As such, as the master battery management system 20 and the plurality of slave battery management systems 22 to 29 perform wireless communication, the wireless link between the master battery management system and the slave battery management system may become unstable according to the surrounding environment. In addition, even when the slave battery management systems 22 to 29 operate normally, the master battery management system 20 may incorrectly determine the soundness of the slave battery management systems 22 to 29 due to link instability.

Specifically, conventionally, the master battery management system 20 directly receives data that each of the slave battery management systems 22 to 29 is to transmit to the master battery management system 20 from the slave battery management systems 22 to 29. That is, each of the slave battery management systems 22 to 29 transmits only data on itself, for example, data on a battery module managed by the slave battery management system 20.

For example, as shown in FIG. 2, the master battery management system 20 receives data from the first, second and fourth slave battery management systems 22, 24, and 28. However, the master battery management system 20 does not receive data from the third and fifth slave battery management systems 26 and 29. In this case, the third slave battery management system 26 fails in transmitting data to the master battery management system 20 because of an error in the BMS itself. Meanwhile, that is the case that the fifth slave battery management system 29 has no problem with the BMS itself, but there is a communication error with the master management system 20 so that data transmitted from the fifth slave battery management system 29 does not reach the master battery management system 20.

In such a manner, the conventional communication method does not distinguish a case where the master battery management system 20 does not receive data due to an error in the slave battery management system itself from a case where the slave battery management system has no problem but there is a communication status error so that the data cannot be received. Therefore, the soundness inspection of the slave BMS cannot be accurately performed by the prior art. The configuration of the present invention to complement this point will be described in detail below.

Figure 3:
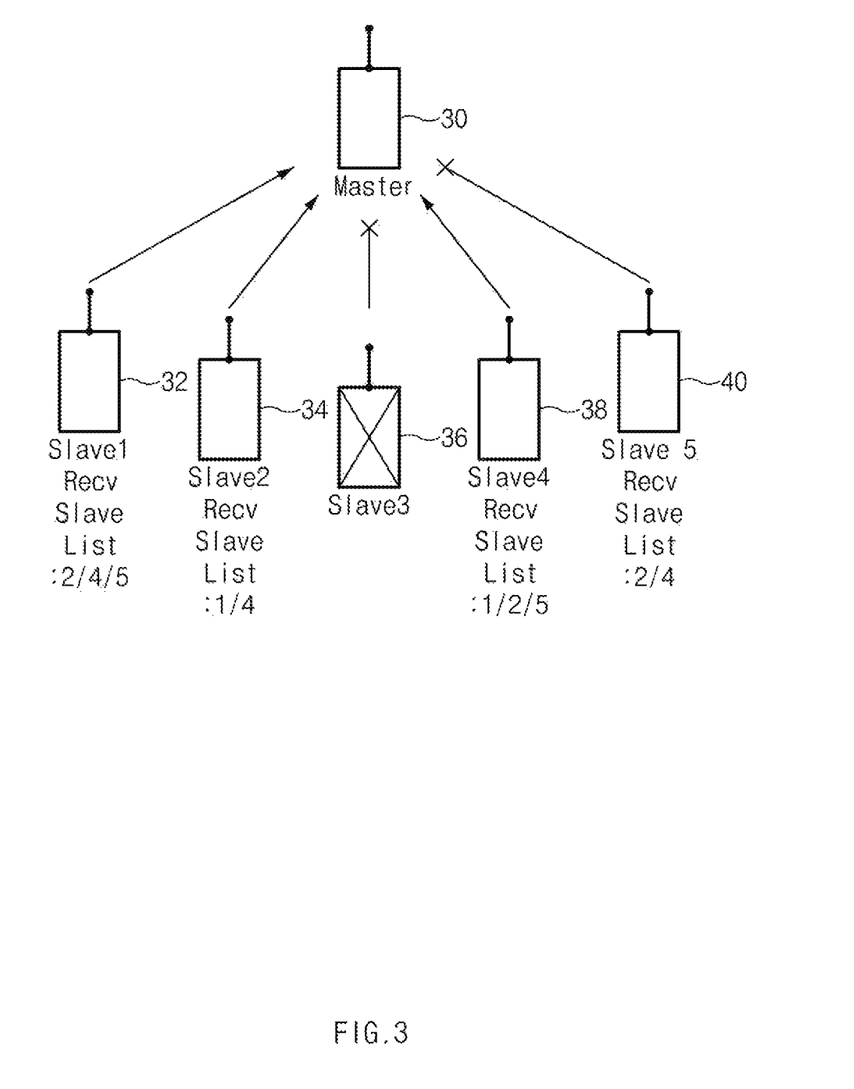
FIG. 3 is a schematic diagram of a slave BMS inspection system according to an embodiment of the present invention.

FIG. 3 is a schematic diagram of a slave BMS inspection system according to an embodiment of the present invention.

The slave BMS inspection system 3 includes a master battery management system 30 and a plurality of slave battery management systems 32 to 40.

The plurality of slave battery management systems 32 to 40 respectively transmit data to the master battery management system 30. When one slave battery management system among the plurality of slave battery management systems 32 to 40 transmits data to the master battery management system 30, at least one other slave battery management system that does not transmit data also receives data signals transmitted by the one slave battery management system to the master battery management system 30. At least one other slave battery management system that does not transmit data associates the received data signal with the at least one other slave battery management system identification information and stores it as data transmission information of the one slave battery management system. Subsequently, when at least one other slave battery management system not transmitting data transmits data to the master battery management system, it transmits data transmission information of the one slave battery management system together. Here, when a specific slave battery management system transmits data to the master battery management system, the transmission signal can be received by another slave battery management system, and the data transmission information is information including a transmission signal received by another slave battery management system. That is, the data transmission information includes information that a specific slave battery management system has transmitted data to the master battery management system.

For example, as shown in FIG. 3, after the first to fifth slave battery management systems 32 to 40 transmit data to the master battery management system 30, respectively, in the next cycle, each slave battery management system has data transmission information of at least one other slave battery management system. However, in this description, although five of the slave battery management system have been described as an example, the number of slave battery management systems may be smaller or larger.

In the previous data transmission period, the first slave battery management system 32 receive the signal when each of the second slave battery management system 34, the fourth slave battery management system 38, and the fifth slave battery management system 40 transmits data to the master battery management system 30. Accordingly, when transmitting data to the master battery management system 30, the first slave battery management system 32 transmits data transmission information of the second slave battery management system 34, the fourth battery management system 38, and the fifth battery management system 40 together.

Also, in the previous data transmission period, the second slave battery management system 34 receives the signal when the first slave battery management system 32 and the fourth slave battery management system 38 respectively transmit data to the master battery management system 30. Accordingly, when transmitting data to the master battery management system 30, the second slave battery management system 34 transmits data transmission information of the first slave battery management system 32 and the fourth slave battery management system 38 together.

Also, in the previous data transmission period, the fourth slave battery management system 38 receives the signal when the first slave battery management system 32, the second slave battery management system 34 and the fifth slave battery management system 40 respectively transmit data to the master battery management system 30. Accordingly, when transmitting data to the master battery management system 30, the fourth slave battery management system 38 transmits data transmission information of the first slave battery management system 32, the second slave battery management system 34, and the fifth slave battery management system 40 together.

Also, in the previous data transmission period, the fifth slave battery management system 40 receives the signal when the second slave battery management system 34 and the fourth slave battery management system 38 respectively transmit data to the master battery management system 30. Accordingly, when transmitting data to the master battery management system 30, the fifth slave battery management system 40 transmits data transmission information of the second slave battery management system 34 and the fourth slave battery management system 38 together.

In this example, the third slave battery management system 36 is configured to not perform the data transmission itself because of slave errors, and the fifth slave battery management system 40 transmits data but has communication error with the master battery management system 30. Thus, the master battery management system 30 does not receive data directly from the third slave battery management system 36 and the fifth slave battery management system 40.

However, since the fifth slave battery management system 40 attempts to transmit data to the master battery management system 30, the master battery management system 30 does not receive the data due to a communication error but data transmission information of the fifth slave battery management system 40 is recorded by another slave battery management system.

The master battery management system 30 receives data of the first slave battery management system 32 and data transmission information of the second slave battery management system, the fourth slave battery management system, and the fifth slave battery management system together from the first slave battery management system 32.

In addition, the master battery management system 30 receives data of the second slave battery management system 34 and data transmission information of the first slave battery management system and the fourth slave battery management system together from the second slave battery management system 34.

In addition, the master battery management system 30 receives data transmission information of the first slave battery management system, the second slave battery management system, and the fifth slave battery management system together from fourth slave battery management system 38.

The master battery management system 30 did not receive data directly from the third slave battery management system 36 and the fifth slave battery management system 40. According thereto, in the related art, the master battery management system 30 may determine that both the third slave battery management system 36 and the fifth slave battery management system have slave errors, but in one embodiment according to the present invention, the master battery management system 30 examines the data transmission information received from each slave battery management system.

The master battery management system 30 checks the soundness of the fifth slave battery management system 40 by checking the history of the data transmitted by the fifth slave battery management system 40 through the data transmission information of the first slave battery management system 32, the second slave battery management system 34, the fourth slave battery management system 38 and the fifth slave battery management system 40, which is received from the first slave battery management system 32, the second slave battery management system 34, and the fourth slave battery management system 38.

Accordingly, the master battery management system 30 determines that there is an error in the slave BMS in the case of the third slave battery system 36, and the fifth slave battery management system 40 determines that there is a communication error.

Meanwhile, all the slave battery management system operates in the reception mode except for the time of communication with the master battery management system to receive the communication state of the other slave battery management system.

Figure 4:
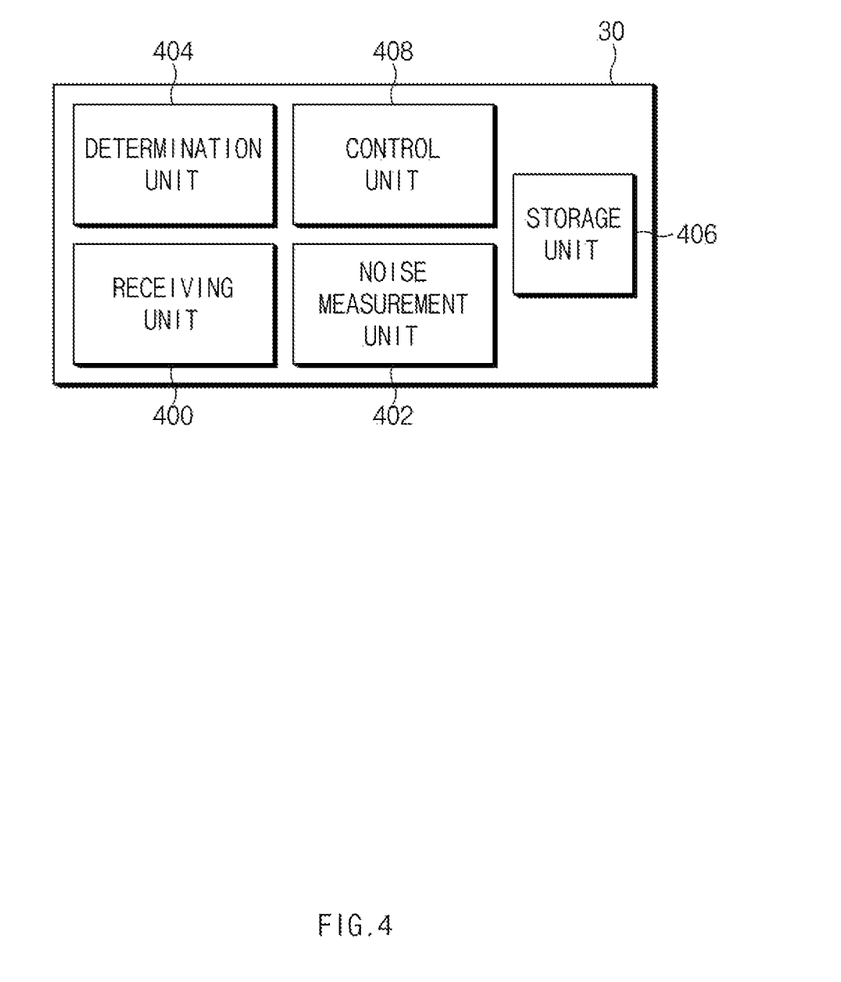
FIG. 4 is a schematic diagram of a master battery management system according to an embodiment of the present invention.

FIG. 4 is a schematic diagram of a master battery management system according to an embodiment of the present invention.

The master battery management system 30 includes a receiving unit 400, a noise measurement unit 402, a determination unit 404, a storage unit 406, and a control unit 408. For the sake of understanding, the operation of each component will be described with reference to the example of FIG. 3.

The receiving unit 400 receives data and data transmission information of the second slave battery management system 34, the fourth slave battery management system 38, and the fifth slave battery management system 40 from the first slave battery management system 32.

In addition, the receiving unit 400 receives data and data transmission information of the first slave battery management system 32, and the fourth slave battery management system 38 from the second slave battery management system 34.

In addition, the receiving unit 400 receives data and data transmission information of the first slave battery management system 32, the second slave battery management system 34, and the fifth slave battery management system 40 from the fourth slave battery management system 38.

The noise measurement unit 402 measures noise of a signal when the receiving unit 400 receives data and data transmission information from each slave battery management system.

The determination unit 404 determines the soundness of each of the plurality of slave battery management systems using the data and the information received at the receiving unit. For example, the determination unit 404 firstly determines the slave battery system that does not directly transmit data, and secondly determines the state of the slave battery system by using the received data transmission information.

The determination unit 404 checks that data is not directly received from the third slave battery management system 36 and the fifth slave battery management system 40. Thereafter, the determination unit 404 examines the data transmission information received by the receiving unit 400. The data transmission information received by the receiving unit 400 includes data transmission information of the first slave battery management system, the second slave battery management system, the fourth slave battery management system, and the fifth slave battery management system. Through this, the determination unit 404 checks the data transmission history of the fifth slave battery management system and determines that there is no error in the fifth slave battery management system.

Accordingly, the determination unit 404 determines the slave error as to the third slave battery management system 36 having no data directly received and no data transmission information. Then, the determination unit 404 determines from the transmission history of the fifth slave battery management system 40, which is not directly received but checked by the data transmission information received from another slave battery management system, that there is no error in the fifth slave battery management system and that an error exists in the communication link.

In addition, when determining that the communication is abnormal, the determination unit 404 may additionally refer to the noise measured by the noise measurement unit 402. For example, if the noise measured by the noise measurement unit 402 basically exceeds a preset criterion, the determination unit 404 may more easily determine a situation in which a communication problem occurs due to a communication error.

The storage unit 406 stores ID information of each of the plurality of slave battery management systems, and the ID information can be used to identify each slave battery management system.

The control unit 408 allows the determination unit 404 to determine an error or communication error of the slave battery management system using the data and data transmission information of the slave battery management system received at the receiving unit 400 and the noise measured by the noise measurement unit 402.

Figure 5:
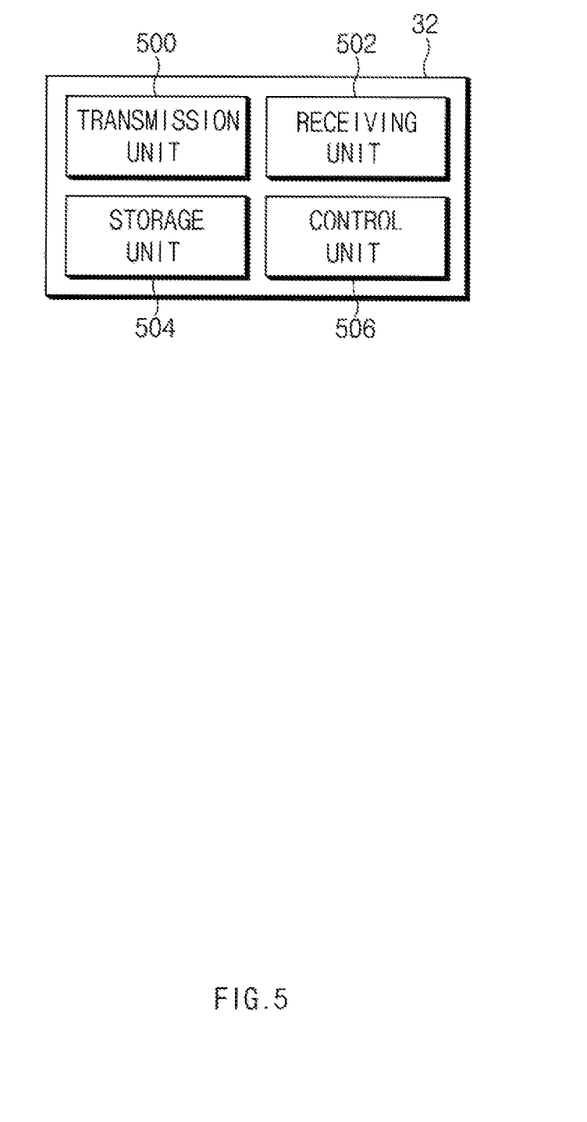
FIG. 5 is a schematic diagram of a slave battery management system according to an embodiment of the present invention.

FIG. 5 is a schematic diagram of a slave battery management system according to an embodiment of the present invention.

The slave battery management system 32 includes a transmission unit 500, a receiving unit 502, a storage unit 504, and a control unit 506.

The transmission unit 500 transmits battery related data and the like to the master battery management system 30. In addition, the transmission unit 500 transmits data transmission information of another slave battery management system to the master battery management system 30.

The receiving unit 502 remains active while the slave battery management system 32 does not transmit data to the master battery management system 30 to receive data transmission signals from other slave battery management systems.

The storage unit 504 stores data transmission information of another slave battery management system based on data transmission signals of other slave battery management systems received at the receiving unit 502.

The control unit 506 activates the receiving unit 502 to receive data transmission signals from other slave battery management systems when the transmission unit 500 does not transmit data and data transmission information to the master battery management system.

Figure 6A:
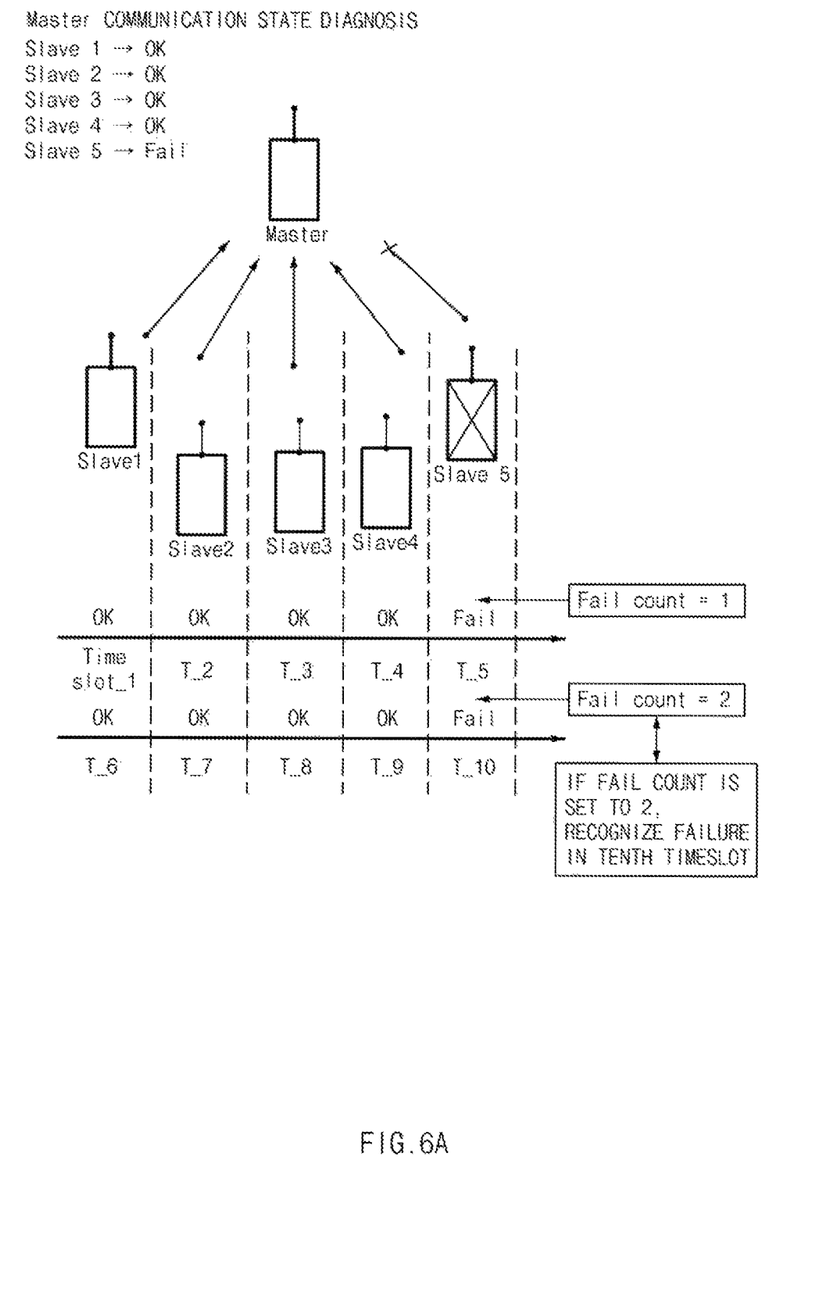
FIG. 6A is a diagram illustrating a reception state for each time interval according to the prior art.

FIG. 6A is a diagram illustrating a reception state for each time interval according to the prior art.

For example, a case in which five slave battery management systems sequentially transmit data to the master battery management system will be described. Each slave battery management system transmits data to the master battery management system in a preset order for a preset time.

At this time, while each slave battery management system respectively transmits data to the master battery management system, if the number of times (fail count) that a particular slave battery management system does not transmit any data to the master battery management system is two, it is configured to determine that there is an error in the slave battery management system.

Specifically, the first slave battery management system transmits data to the master battery management system in the timeslot T_1. In addition, the second slave battery management system transmits data to the master battery management system in the timeslot T_2. In addition, the third slave battery management system transmits data to the master battery management system in the timeslot T_3. Furthermore, the fourth slave battery management system transmits data to the master battery management system in the timeslot T_4. Here, the fifth slave battery management system transmits no data due to BMS errors. Here, the master battery management system determines that no data has been received from the fifth slave battery management system in the timeslot T_5 and counts a fail count 1. Thus, one communication period between the five slave battery management systems and the master battery management system is completed.

Then, the first slave battery management system transmits data again to the master battery management system in the timeslot T_1. In addition, the second slave battery management system transmits data to the master battery management system in the timeslot T_2. In addition, the third slave battery management system transmits data to the master battery management system in the timeslot T_3. Furthermore, the fourth slave battery management system transmits data to the master battery management system in the timeslot T_4. At this time, since each slave battery management system transmits only the data of the slave battery management system to the master battery management system, the master battery management system is in a state where the fail count of the fifth slave battery management system is still one.

Thus, when the transmission order of the fifth slave battery management system in the second period is returned, the master battery management system checks that the data transmission of the fifth slave battery management system is not made, and counts the fail count to 2 to detect an error of the fifth slave battery management system. That is, in the prior art, it may be determined whether the slave battery management system is abnormal when the second period transmission order of the slave battery management system is reached. In comparison with this, an inspection system of a slave battery management system through a method according to an embodiment of the present invention will be described.

Figure 6B:
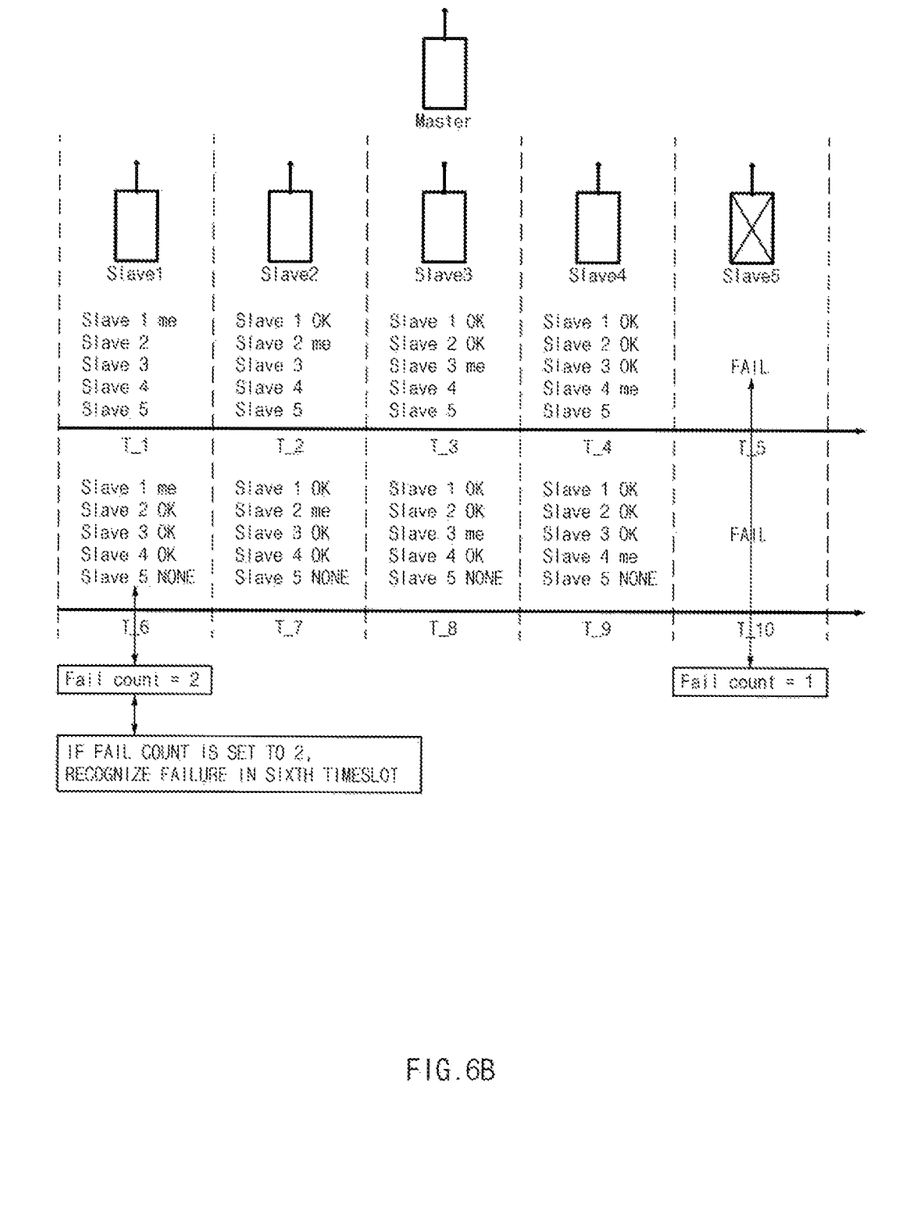
FIG. 6B is a diagram illustrating a reception state for each time interval according to an embodiment of the present invention.

FIG. 6B is a diagram illustrating a reception state for each time interval according to an embodiment of the present invention.

For example, a case in which five slave battery management systems sequentially transmit data to the master battery management system will be described. Each slave battery management system transmits data to the master battery management system in a preset order for a preset time.

At this time, while each slave battery management system respectively transmits data to the master battery management system, if the number of times that a particular slave battery management system does not transmit any data to the master battery management system is two, it is configured to determine that there is an error in the slave battery management system.

In addition, the embodiment of the present invention, another slave battery management system may receive this data transmission signal when transmitting data to the master battery management system, In this example, it is assumed that a slave battery management system other than the slave battery management system transmitting data receives all signals that the slave battery management system transmits data and this will be described.

Specifically, the first slave battery management system transmits data to the master battery management system in the timeslot T_1. At this time, the two to fourth slave battery management systems receive the data transmission signal of the first slave battery management system.

In addition, the second slave battery management system transmits data to the master battery management system in the timeslot T_2. In this case, the first slave battery management system, the third slave battery management system, and the fourth slave battery management system receive a data transmission signal of the second slave battery management system.

In addition, the third slave battery management system transmits data to the master battery management system in the timeslot T_3. In this case, the first slave battery management system, the second slave battery management system, and the fourth slave battery management system receive a data transmission signal of the third slave battery management system.

Furthermore, the fourth slave battery management system transmits data to the master battery management system in the timeslot T_4. In this case, the first to third slave battery management systems receive a data transmission signal of the fourth slave battery management system.

Here, the master battery management system determines that no data has been received from the fifth slave battery management system in the timeslot T_5 and counts a fail count 1. Thus, one communication period between the five slave battery management systems and the master battery management system is completed.

Then, the first slave battery management system transmits data again to the master battery management system in the timeslot T_1. At this time, when transmitting data, the first slave battery management system transmits data transmission information together, including data transmission signals of the second to fourth slave battery management systems received in the previous period. At this time, the master slave battery management system checks that there is no data transmission information of the fifth slave battery management system, counts the fail count to 2, and detects an error of the fifth slave battery management system. That is, according to the present invention different from the prior art, since each slave battery management system receives data transmission signals of other slave battery management systems, even if the second cycle transmission order of a specific slave battery management system is not reached when a specific slave battery management system is abnormal, the master battery management system may determine faster than the prior art whether the specific slave battery management system is abnormal.

Figure 7:
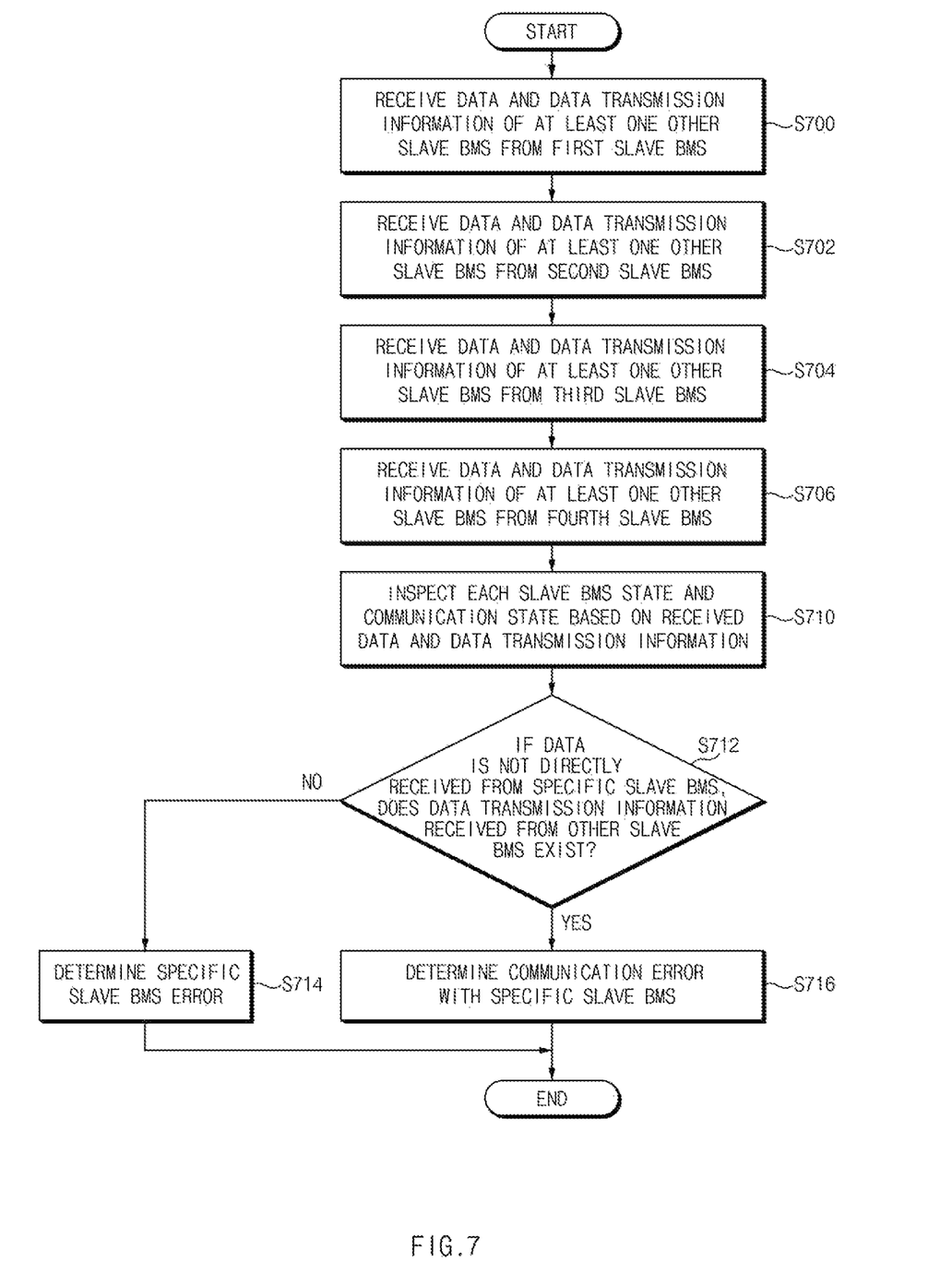
FIG. 7 is a flowchart illustrating a slave BMS inspection method according to an embodiment of the present invention.

FIG. 7 is a flowchart illustrating a slave BMS inspection method according to an embodiment of the present invention.

Each slave battery management system transmits data to the master battery management system in a preset order for a preset time. In addition, the master battery management system 30 receives data transmission information of the slave BMS other than the slave BMS together with the data of the slave BMS from the slave BMS. This will be described in detail below.

The master battery management system 30 receives data and data transmission information of at least one other slave BMS from the first slave BMS (S700).

The data transmission information of another slave BMS is based on the data transmission signal of another slave BMS transmitting data to the master battery management system while the first slave BMS does not transmit data.

Then, the master battery management system 30 receives data and data transmission information of at least one other slave BMS from the second slave BMS (S702).

In addition, the master battery management system 30 receives data and data transmission information of at least one other slave BMS from the third slave BMS (S704).

In addition, the master battery management system 30 receives data and data transmission information of at least one other slave BMS from the fourth slave BMS (S706).

Subsequently, the master battery management system 30 inspects a state and a communication state of each slave BMS by using the received data and data transmission information (S710).

Specifically, the master battery management system 30 determines the soundness of each of the plurality of slave battery management systems using the received data and data transmission information.

For example, the master battery management system 30 firstly determines the slave battery system that does not directly transmit data, and secondly determines the state of the slave battery system by using the received data transmission information.

If data is not directly received from a specific slave BMS, it is determined whether data transmission information of the specific slave BMS is received from another slave BMS (S712).

When the data transmission information of the specific slave BMS is received, it is determined that the communication with the specific slave BMS is abnormal (S716).

If data transmission information of the specific slave BMS is not received, it is determined that the specific slave BMS is abnormal (S714).

Figure 8:
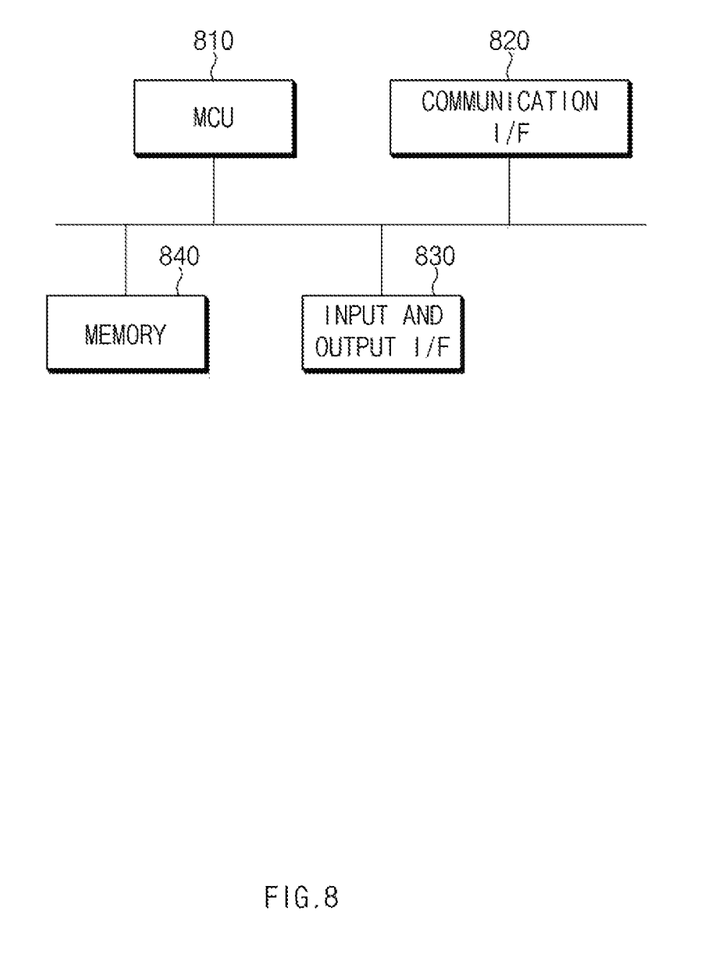
FIG. 8 is a block diagram illustrating a hardware configuration of a battery management system according to an embodiment of the present invention.

FIG. 8 is a block diagram illustrating a hardware configuration of a battery management system according to an embodiment of the present invention.

A battery management system 800 may include a microcontroller unit (MCU) 810 for controlling various processes and components, a memory 840 in which an operating system program and various programs (for example, a battery pack abnormality diagnosis program or a battery pack temperature estimation program) are recorded, an input/output interface 830 for providing an input interface and an output interface between the battery cell module and/or the semiconductor switching element, and a communication interface 820 capable of communicating with the outside through a wired or wireless communication network. As described above, the computer program according to the present invention may be recorded in the memory 840 and processed by the microcontroller 810 to be implemented as a module for performing the respective functional blocks shown in FIG. 4 and FIG. 5.

Reference herein to 'one embodiment' of the principles of the present invention and various modifications of such expressions means that, in relation to this embodiment, the specific features, structures, characteristics, and the like are included in at least one embodiment of the principles of the present invention. Thus, the expression 'in one embodiment' and any other modifications disclosed throughout the specification are not necessarily all referring to the same embodiment.

All the embodiments and conditional examples disclosed in this specification are described to intend to help those skilled in the art to understand the principles and concepts of the present disclosure, so that it will be understood by those skilled in the art that various changes in form and details may be made therein without departing from the spirit and scope of the present disclosure. Therefore, the disclosed embodiments should be considered in descriptive sense only not in limited perspective sense. The scope of the invention is defined not by the detailed description of the invention but by the appended claims, and all differences within the scope will be construed as being included in the present invention.

The invention claimed is:

1. A master battery management system (BMS) included in a battery system in which a plurality of slave BMSs and a master BMS communicate wirelessly, the master BMS comprising:
   a receiving unit configured to receive during a transmission period, from each respective slave BMS of the plurality of slave BMSs, (i) data of the respective slave BMS and (ii) data transmission information indicating that another slave BMS other than the respective slave BMS transmitted data to the master BMS, wherein each of the plurality of slave BMSs is configured to transmit data at least once during the transmission period; and
   a determination unit configured to:
      identify an error between the master BMS and at least one of the plurality of slave BMSs; and
      determine a cause of the error based on the data and the data transmission information received from each slave BMS during the transmission period.

2. The master BMS of claim 1, wherein the determination unit is configured to identify the error for a given slave BMS when there is no data directly received from the given slave BMS during the transmission period.

3. The master BMS of claim 2, wherein the determination unit is configured to determine that the cause of the error is a communication error between the given slave BMS and the master BMS based on the data transmission information received at the receiving unit including an indication that the given slave BMS transmitted data to the master BMS and the data received at the receiving unit not including data from the given slave BMS.

4. The master BMS of claim 1, further comprising a noise measurement unit configured to measure noise of data received from the plurality of slave BMSs,
   wherein the determination unit is configured to determine a communication possible state in which communication with the plurality of slave BMSs is possible based on the noise measured in the noise measurement unit.

5. A first slave battery management system (BMS) included in a battery system in which a plurality of slave BMSs and a master BMS communicate wirelessly, the first slave BMS comprising:

a receiving unit configured to receive a data signal from a second slave BMS, wherein the data signal is directed to the master BMS;

a storage unit configured to store data transmission information indicating that the second slave BMS transmitted data to the master BMS based on the received data signal; and a transmission unit configured to transmit, to the master BMS, the data transmission information indicating that the second slave BMS transmitted data to the master BMS.

6. The slave BMS of claim 5, wherein during a transmission period, the transmission unit is configured to transmit data of the first slave BMS along with the data transmission information to the master BMS at least once.

7. A slave BMS inspection system including the master battery management system (BMS) of claim 1, wherein each of the plurality of slave BMSs comprises:

a slave receiving unit configured to receive a data signal from at least one other slave BMS, wherein the data signal is directed to the master BMS;

a storage unit configured to store data transmission information indicating that the at least one other slave BMS transmitted data to the master BMS based on the received data signal; and a transmission unit configured to transmit, to the master BMS, the data transmission information indicating that the at least one other slave BMS transmitted data to the master BMS.

8. The slave BMS inspection system of claim 7, wherein the determination unit is configured to identify the error for a given slave BMS when there is no data directly received from the given slave BMS during the transmission period.

9. The slave BMS inspection system of claim 8, wherein the determination unit is configured to determine that the cause of the error is a communication error between the given slave BMS and the master BMS based on the data transmission information received at the receiving unit including an indication that the given slave BMS transmitted data to the master BMS and the data received at the receiving unit not including data from the given slave BMS.

10. A slave battery management system (BMS) inspection method performed by a master BMS, the slave BMS inspection method comprising:

receiving data signals sequentially from each of a plurality of slave BMSs, wherein the received data from each respective BMS includes (i) data of the respective slave BMS from which the data signals are received, received together with (ii) data transmission information indicating that another slave BMS other than the respective slave BMS transmitted data to the master BMS;

identifying an error between the master BMS and a specific slave BMS based on the received data signals; and determining a cause of the error based on a combination of the data and the data transmission information received from each of the plurality of slave BMSs.

11. The slave BMS inspection method of claim 10, wherein determining the cause of the error comprises determining that the cause of the error occurs in a specific slave BMS in response to determining that there is no data directly received from the specific slave BMS and that there is no data transmission information received from any of the plurality of slave BMSs indicating that the specific slave BMS transmitted data to the master BMS.

12. The slave BMS inspection method of claim 10, wherein the determining the cause of the error comprises determining that the cause of the error is a communication error between the master BMS and a specific slave BMS in response to determining that there is data transmission information received from any of the plurality of slave BMSs indicating that the specific slave BMS transmitted data to the master BMS but there is no data directly received from the specific slave BMS.

13. The slave BMS inspection method of claim 10, further comprising:

measuring noise of received data when communicating with the plurality of slave BMSs; and determining a state in which communication with the plurality of slave BMSs is possible based on the measured noise.

14. The first slave BMS of claim 5, wherein the receiving unit is configured to receive a respective data signal from each slave BMS other than the first slave BMS, wherein each data signal is directed to the master BMS, wherein the storage unit is configured to store data transmission information indicating that each other slave BMS transmitted data to the master BMS based on the respective received data signals, and wherein the transmission unit is configured to transmit to the master BMS, the data transmission information indicating that each other slave BMS transmitted data to the master BMS.

15. The first slave BMS of claim 5, wherein the data signal includes battery information of a battery module managed by the first slave BMS.

16. The slave BMS inspection system of claim 7, wherein the data signal includes battery information of a battery module managed by the first slave BMS.

17. The master BMS of claim 2, wherein the determination unit is configured to determine that the cause of the error occurs in a specific slave BMS in response to a determination that there is no data directly received from the specific slave BMS and that there is no data transmission information received from any of the plurality of slave BMSs indicating that the specific slave BMS transmitted data to the master BMS.

* * * * *